United States Patent [19]

Nozaki et al.

[11] 4,298,629
[45] Nov. 3, 1981

[54] METHOD FOR FORMING A NITRIDE INSULATING FILM ON A SILICON SEMICONDUCTOR SUBSTRATE SURFACE BY DIRECT NITRIDATION

[75] Inventors: Takao Nozaki, Yokohama; Takashi Ito, Kawasaki; Hideki Arakawa; Hajime Ishikawa, both of Yokohama; Masaichi Shinoda, Sagamihara, all of Japan

[73] Assignee: Fujitsu Limited, Kawasaki, Japan

[21] Appl. No.: 128,172

[22] Filed: Mar. 7, 1980

[30] Foreign Application Priority Data

Mar. 9, 1979 [JP] Japan ................................ 54-27301

[51] Int. Cl.³ ............................................. C23C 11/00
[52] U.S. Cl. ..................... 427/39; 204/177; 427/45.1; 427/46; 427/53.1; 427/94
[58] Field of Search ............ 427/38, 39, 40, 46, 427/94, 45, 53.1; 204/164, 177

[56] References Cited

U.S. PATENT DOCUMENTS

| | | | |
|---|---|---|---|
| 3,108,900 | 10/1963 | Papp | 427/39 |
| 3,424,661 | 1/1969 | Androshuk et al. | 427/39 |
| 3,728,051 | 4/1973 | Humbert | 204/177 |
| 3,730,863 | 5/1973 | Keller | 204/177 |
| 4,113,515 | 9/1978 | Kool et al. | 427/94 |
| 4,142,004 | 2/1979 | Hauser et al. | 427/39 |
| 4,179,618 | 12/1979 | Tanaka et al. | 204/177 |
| 4,181,541 | 1/1980 | LeFrancois | 204/164 |
| 4,206,190 | 6/1980 | Harvey et al. | 204/164 |
| 4,212,687 | 7/1980 | Tanaka et al. | 204/177 |

FOREIGN PATENT DOCUMENTS

| | | | |
|---|---|---|---|
| 1964942 | 7/1971 | Fed. Rep. of Germany | 427/39 |
| 5319291 | 6/1978 | Japan | 427/39 |

Primary Examiner—John H. Newsome
Attorney, Agent, or Firm—Staas & Halsey

[57] ABSTRACT

In a method for forming an insulating film on a semiconductor substrate surface, the silicon nitride of the insulating film has been formed by a plasma CVD or a direct nitridation. In the present invention, a gas plasma of a nitrogen-containing gas is generated in a direct nitridation reaction chamber, and the semiconductor silicon body is heated to a temperature of from approximately 800 to approximately 1300° C. within the gas plasma atmosphere, thereby forming the silicon nitride film. The resulting silicon nitride film has a dense structure and a low oxygen concentration and a thick silicon nitride film is formed in a short period by direct nitridation of silicon.

30 Claims, 15 Drawing Figures

METHOD FOR FORMING A NITRIDE INSULATING FILM ON A SILICON SEMICONDUCTOR SUBSTRATE SURFACE BY DIRECT NITRIDATION

BACKGROUND OF THE INVENTION

1. Field of the Invention

The present invention relates to a method for forming an insulating film on a semiconductor substrate surface. More particularly, the present invention relates to a method for forming a silicon nitride film, which exhibits an excellent stability in electrical properties and a high degree of density, on a surface of a semiconductor substrate, which film covered semiconductor substrate is useful for the production of integrated circuits (IC).

2. Description of the Prior Art

In the production of semiconductor devices, it is known to coat a portion of the semiconductor surface, in which a PN junction is exposed to an ambient atmosphere, with an insulating film in order to prevent changes in the electrical properties of the semiconductor device with the lapse of time and to enhance the reliability of the semiconductor device. In the production of MISFET (metal insulator semiconductor field effect transistor) or MIS type integrated circuits, it is also known to form a gate insulating film in the semiconductor device, so as to introduce an inversion layer channel into the device. Generally speaking, in the conventional MISFET and MIS type integrated circuits, the semiconductor substrate, the insulating film and the metal gate electrode, respectively, consist essentially of silicon (Si), silicon oxide ($SiO_2$) and aluminum (Al).

The above-mentioned structure of the conventional metal insulator semiconductor device, however, exhibits a disadvantage in that an application of an electric field of about $10^6$ V/cm across the insulating film at a temperature of about 200° C. results in a remarkable fluctuation of a gate threshold voltage. This disadvantageous phenomenon may be due to the fact that the drift effect of impurity ions contained in the $SiO_2$ insulating film or the structural defects of the $SiO_2$ insulating film per se cause the creation of a capture level of carriers, and the creation of the capture level of carriers results in a remarkable fluctuation in the space charge distribution in the surface layer of the semiconductor device. It is clear that the fluctuation in the space charge distribution is influenced most remarkably by the structural defects in the interface between the Si substrate and the insulating film ($SiO_2$). The structural defects are created when the insulating film ($SiO_2$) is formed by thermally oxidizing the surface layer of the Si substrate. This thermal oxidization process tends to permit the impurity ions, such as alkali metal ions, to contaminate the oxidized silicon film.

In order to eliminate the above-mentioned defects from the conventional insulating film, attempts have been made to provide an insulating film by way of chemical vapor deposition or sputtering. However, all such attempts have failed to reduce the structural defects in the interface between the Si substrate and the $SiO_2$ layer to a level lower than that resulting from thermal oxidation.

Furthermore, it is known that when the surface of the Si substrate is thermally oxidized in an extremely clean atmosphere, the resultant $SiO_2$ film exhibits very little structural defects at a level of surface charge density of $10^{11}/cm^2$ or less. However, the interface between the Si substrate and the $SiO_2$ film still exhibits structural defects due to excessive silicon ions. Accordingly, it has been strongly desired to eliminate the above-mentioned defects from the interface between the Si substrate and the $SiO_2$ film.

It is known to form a silicon nitride film by a so called plasma CVD process as illustrated in FIG. 1. Referring to FIG. 1, a nitrogen containing gas, such as nitrogen ($N_2$) or ammonia ($NH_3$), is admitted through a first inlet 10 into a reaction chamber 11, while a silicon containing gas, such as monosilane ($SiH_4$), is admitted through a second inlet 12 into the reaction chamber 11. The reaction chamber 11 is evacuated by a not shown vacuum pump connected to an outlet 13. A radio frequency current of, for example, 13.65 MHz, is applied by means of a coil 14 to the nitrogen containing gas in the reaction chamber 11, so as to form a gas plasma. A silicon wafer 15 is heated by a heater 16 to a temperature of from 100° to 500° C. and a silicon nitride is deposited on the silicon wafer due to a reaction between the monosilane and nitrogen in the plasma state. Instead of induction coupling by the radio frequency current, the gas plasma can be created by a capacitance coupling between a pair of electrodes. The silicon nitride film produced by the plasma CVD process exhibits a relatively low stoichiometry and, therefore, not stoichiometric ions, such as silicon ions, cause generation of defects at the interface between the silicon nitride film and the silicon wafer.

It is already known that a nitridation reaction of silicon proceeds by heating a silicon substrate to an elevated temperature in a nitrogen or ammonia atmosphere. However, the nitride film produced by such a nitridation reaction disadvantageously includes a high concentration of oxygen resulting from ammonia and a nitridation reaction tube made of quartz. In addition, it is difficult to form a uniformly amorphous film of silicon nitride. As a result, the silicon nitride film produced by the known nitridation reaction disadvantageously exhibits a low resistivity due to current conduction through the grain boundaries of a locally polycrystalline film of silicon nitride. Furthermore, in the known nitridation reaction, the nitridation reaction requires a high temperature and long reaction time for forming a nitride film having a thickness more than 50 Å. For example, in the case of using ammonia gas, a nitridation reaction temperature of 1200° C. and a nitridation reaction time of 200 minutes or longer are required for forming a nitride film of such thickness.

If the thickness of nitride film is 50 Å or less, the resistivity thereof is too low to use the film as an insulating film due to a tunnel current through the nitride film.

It is known from European Laid Open Application No. 0006706 (European Patent Application No. 79301114.9, filed by Fujitsu Limited) to form an insulating film by a direct nitridation in a nitrogen or ammonia atmosphere of a silicon dioxide film which is formed on a silicon substrate. A dense structure of the insulating film is provided by the nitridation of the silicon dioxide film. However, it was found by the present inventors that a relatively high concentration of oxygen in the insulating film causes generation of structural defects at the interface between the insulating film and the silicon substrate.

SUMMARY OF THE INVENTION

An object of the present invention is to improve the known methods of direct nitridation of silicon, so that the resulting silicon nitride film has a dense structure and a low oxygen concentration.

Another object of the present invention is to form a thick silicon nitride film in a short period of direct nitridation of silicon.

In accordance with the objects of the present invention, there is provided a method for forming an insulating film on a semiconductor body surface, wherein an insulating film of silicon nitride is formed by direct nitridation of at least one semiconductor silicon body positioned in a direct nitridation reaction chamber, characterized in that a gas plasma of a nitrogen-containing gas is generated in the direct nitridation reaction chamber, and the semiconductor silicon body is heated to a temperature of from approximately 800° to approximately 1300° C. within the gas plasma atmosphere, thereby forming the silicon nitride film.

The nitrogen containing gas may be nitrogen ($N_2$), ammonia ($NH_3$) or hydrazine ($N_2H_4$), or a mixture thereof. The nitrogen containing gas may also be a mixture of one or more of nitrogen, ammonia and hydrazine with one or more of hydrogen ($H_2$), hydrogen chloride (HCl) and halogen gas. The nitrogen containing gas may further include an essentially inet gas, such as argon (Ar).

In the direct nitridation method of the present invention, the silicon component of the silicon nitride film is not deposited on the semiconductor silicon substrate due to a reaction between the silicon and nitrogen containing gases, but is present in the semiconductor silicon body such as a semiconductor silicon substrate. In addition, the semiconductor silicon substrate is heated in accordance with the present invention to a relatively high temperature. As a result, the stoichiometry of the silicon nitride film is superior to that in the plasma CVD process, wherein the plasma gas of ammonia ($NH_3$) is brought into contact with monosilane ($SiH_4$) at a low temperature.

BRIEF DESCRIPTION OF THE DRAWINGS

The present invention is explained hereinafter with reference to FIGS. 2 through 15, wherein.

DETAILED DESCRIPTION OF THE PREFERRED EMBODIMENTS

Figure 1:
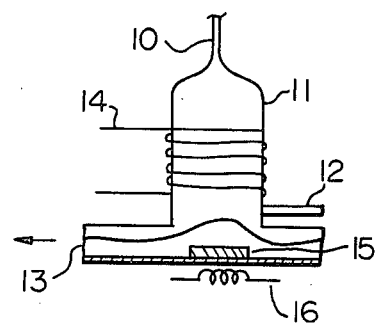
Figure 2:
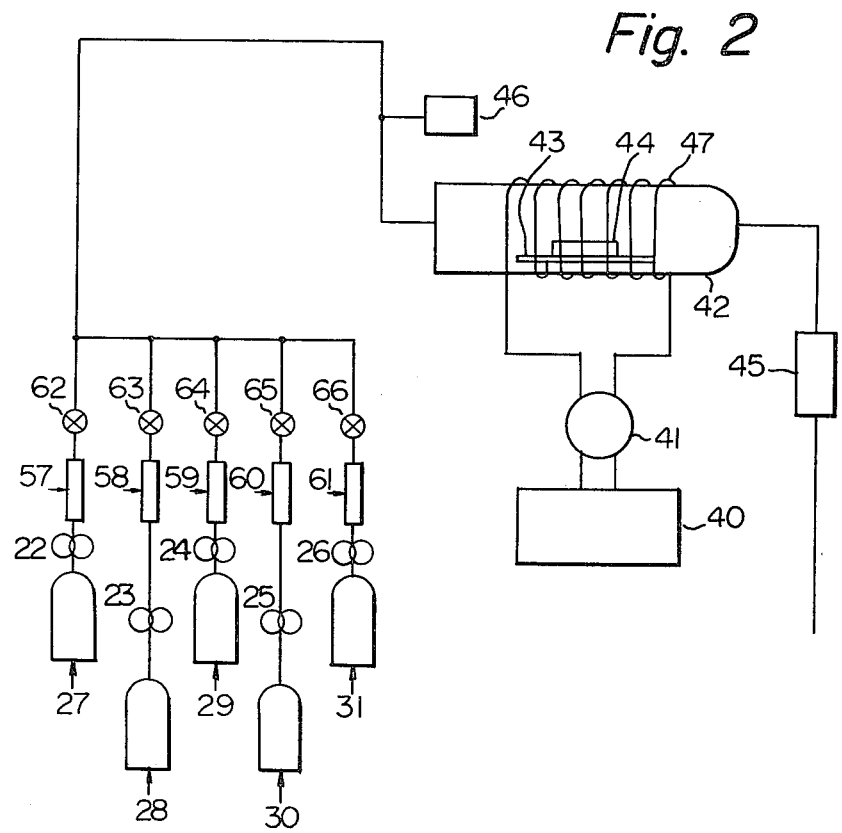
FIG. 2 is a schematic drawing of an apparatus for the direct nitridation of a semiconductor silicon substrate according to the present invention.

Referring to FIG. 2, the direct nitridation reaction chamber 42, hereinafter referred to as a reaction chamber 42, is surrounded with a coil 47 and the coil 47 is connected via a wattmeter 41 to a high frequency power source 40. The frequency of the high frequency power may be from 10 to $10^4$ KHz. The reaction chamber 42 is made of quartz and includes therein a carbon boat 43 provided with a coating of silicon carbide. A silicon wafer or substrate 44 preferably produced by a floating zone method is supported on the carbon boat 43 and heated through the heat of carbon boat 43, which is heated by an induction heating of the coil 47. The reaction chamber 42 is communicated with an evacuating device 45.

Gas cylinders 27 through 31 are communicated to the reaction chamber 42 via pressure-control devices 22 through 26, mass flow control meters 57 through 61 and valves 62 and 66. Contained in the gas cylinders 27, 28, 29, 30 and 31, are nitrogen gas, hydrogen gas, ammonia gas, hydrogen chloride gas and chlorine gas, respectively. The pressure-control devices and the mass flow control meters control the flow rate of each of the gases.

The silicon substrate 44 is cleaned so as to remove a naturally oxidized film and heavy metals thereon, and then, is inserted into the region of a reaction chamber 42 on the carbon boat 43, which region is induction coupled with the coil 47. After inserting the silicon substrate 44, the nitrogen gas is caused to flow from the gas cylinder 27 into the reaction chamber 42 at a rate of, for example, 5 l/minute, for period of from 2 to 3 minutes. The nitrogen gas flow is then stopped by the valve 62 and the valve 64 is immediately opened. The flow rate of the ammonia gas is controlled so that it is a constant value, for example 5 l/minute, by the pressure control device 24 and the mass flow control meter 59. The evacuating device 45 is subsequently operated, so that the pressure within the reaction chamber 42 is caused to be from $10^{-2}$ to 10 torr. This pressure is maintained for a period of a few minutes by controlling the evacuating gas flow. While the pressure mentioned above is maintained, the valves 62, 64, 65 and 66 are kept closed. Subsequently, a high frequency power is applied from the high frequency power source 40 to the induction-coupled region of the reaction chamber 42. The frequency of the high frequency power is, for example, 400 KHz, and the voltage thereof is controlled so that it is a constant value of, for example, 6 kV.

The ammonia gas is supplied into the reaction chamber 42 and is converted to a gas plasma within the reaction chamber 42. The silicon substrate 43 is heated in the gas plasma atmosphere of the reaction chamber 42 to a high temperature, which is determined by the dimensions of the carbon boat 43 and the electric power of the high frequency power source 40. When the size of the carbon boat 44 is 50 mm in diameter and 5 mm in thickness and, further, the voltage of the high frequency power is from 3 to 8 kV, the heating temperature of the silicon substrate is from approximately 800° to 1300° C. After a lapse of a predetermined time period in the range of, for example, 1 to $10^3$ minutes, the high frequency power is cut off and the silicon substrate 44 is allowed to cool for a period of, for example, 5 minutes, within the ammonia atmosphere. The valve 64 is then closed to stop the inflow of the ammonia gas into the reaction chamber 42, and immediately after closing of valve 64, the valve 62 is opened to introduce the nitrogen gas into the reaction chamber 42. The nitrogen gas is caused to flow in the reaction chamber 42 for a predetermined period of time and, then, the operation of evacuating device 45 is stopped. The flow of the nitrogen gas is continued in the reaction chamber 45 until the pressure within the reaction chamber arrives at an atmospheric pressure. Subsequently, the silicon substrate 44 is removed from the reaction chamber 42. As a result, a silicon substrate 44 having a silicon nitride film formed thereon is obtained.

FIGS. 3 through 6 graphically illustrate the results of experiments conducted by the inventors of the present invention.

Figure 3:
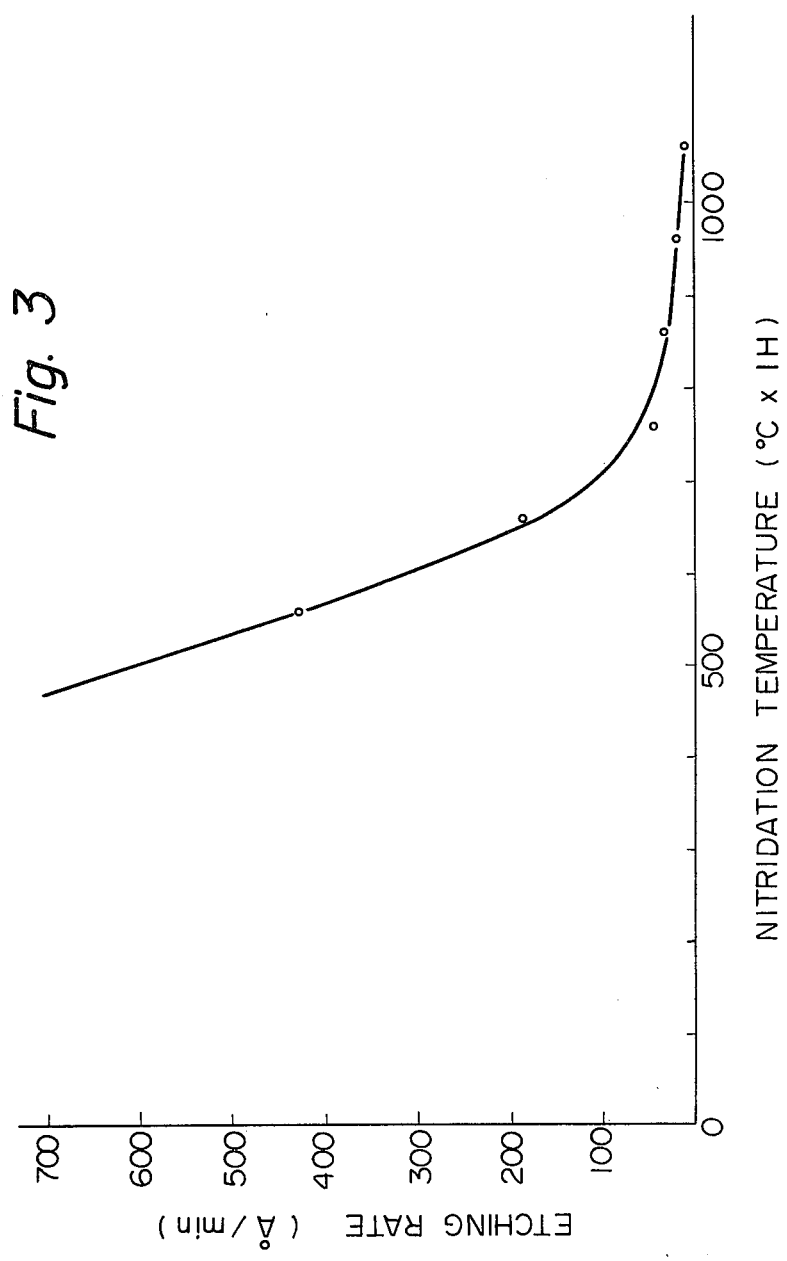
FIG. 3 graphically illustrates an etching rate of silicon nitride film formed by a direct nitridation of silicon under a plasma gas.

In FIG. 3, the relationship between the etching rate of a silicon nitride film and the nitridation temperature of the silicon substrate 44 is graphically illustrated. Referring to FIG. 3, silicon nitride was formed by the method as explained with reference to FIG. 2. The nitridation temperature was varied from 560° C. to 1060° C. The silicon nitride film was etched by a solution containing 7 volume parts of ammonium fluoride ($NH_4F$) and 1 volume part of hydrofluoric acid (HF) at a temperature of 24° C. As is apparent from FIG. 3, the etching rate of the silicon nitride film is very low at the nitridation temperature of 800° C. or higher. The structurally dense nitride film can, therefore, be obtained at the nitridation temperature of 800° C. or higher. The etching rate of the silicon nitride film formed at the nitridation temperature of 800° C. is approximately equal to that of a stable silicon nitride which is formed by a known direct thermal nitridation of silicon at 1200° C. under a nonplasma state. The nitridation temperature is preferably from 800° C. to 1200° C. Since plasma gases are reactive, a silicon nitride film can be formed at a relatively low temperature, for example, from 300° to 400° C., in the plasma CVD process. It is to be noted that the structurally dense silicon nitride film can be formed in the gas plasma atmosphere at a high temperature of 800° C. or higher.

When a silicon dioxide film was etched by the solution mentioned above, the etching rate was approximately 1000 Å/min.

In Table 1, below, the results of electron spectroscopy for chemical analysis (ESCA) of surfaces of several silicon nitride films are illustrated. Referring to Table 1, the silicon nitride films in the left four columns (plasma) were produced by the method described above with reference to FIG. 2. In the formation of the silicon nitride films of the left two columns, a mixture of nitrogen and hydrogen gases was used and the volume ratio of these gases was as indicated in Table 1. In the formation of the silicon nitride film of the column denoted $N_2/NH_3$, a mixture gas of nitrogen and ammonia was used. The nitridation to form the silicon nitride film of the left four columns of Table 1 was carried out at 1050° C. for a period of 1 hour. The silicon nitride film of the column denoted "(Thermal, 1200° C.)" was produced by a known thermal nitridation film using an ammonia ($NH_3$) gas at a temperature of 1200° C.

TABLE 1

| | GAS | | | | |
|---|---|---|---|---|---|
| Element | $N_2/H_2$ = 1/1 (Plasma) | $N_2/H_2$ = 3/1 (Plasma) | $NH_3$ 100% (Plasma) | $N_2/NH_3$ = 1/1 (Plasma) | $NH_3$ 100% (Thermal 1,200° C.) |
| O | 11 | 15 | 9 | 12 | 18 |
| N | 21 | 14 | 23 | 18 | 13 |
| C | 9 | 9 | 11 | 11 | 5 |
| Si | 59 | 61 | 57 | 59 | 64 |
| N/O | 1.91 | 0.93 | 2.56 | 1.50 | 0.72 |

An ESCA analysis of the surface of the silicon nitride films was conducted. The O in Table 1, above, includes the oxygen which is adsorbed on the surface of the silicon nitride films as foreign matter. It will be apparent from the ratio of "N/O" that the oxygen concentration in the silicon nitride film can be reduced in accordance with the present invention as compared with that by the known direct thermal nitridation. Ammonia gas is the most preferable gas as the nitrogen containing gas, because the ratio of "N/O" is the lowest in Table 1, above. When the mixture of hydrogen gas and nitrogen gas is used as the nitrogen containing gas, the relative amount of hydrogen to nitrogen should be high.

Although not mentioned in Table 1, nitrogen gas could be used as the nitrogen containing gas.

Figure 4:
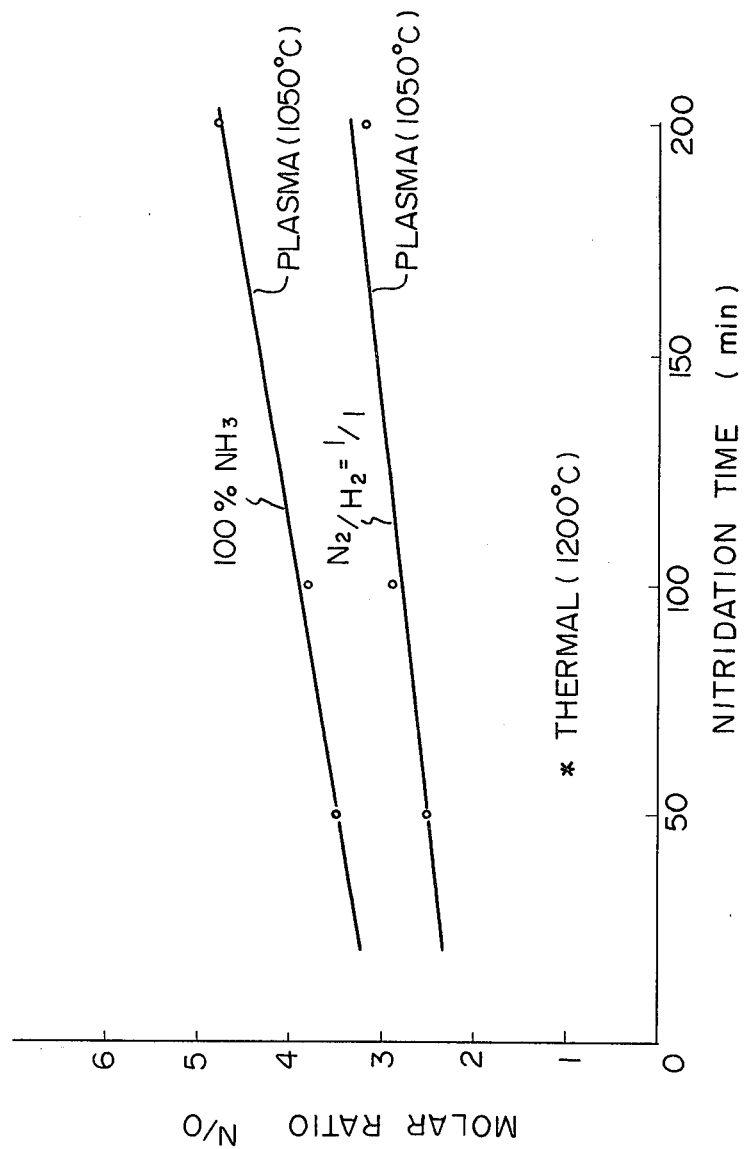
FIG. 4 graphically illustrates a molar ratio of a silicon nitride film formed by direct nitridation according to the present invention and a known process.

Referring to FIG. 4, the molar ratios of N/O of silicon nitride films formed by the following methods are graphically illustrated.

"Plasma": the silicon nitride films were formed by the method of the present invention, wherein the nitrogen containing gas was 100% ammonia ($NH_3$) gas or a mixture of nitrogen ($N_2$) and hydrogen ($H_2$) in an equal volume ratio, and further, the nitridation temperature was 1050° C.

"Thermal": the silicon nitride film was formed at 1200° C. by a known direct thermal nitridation of silicon using an ammonia gas ($NH_3$).

As is apparent from FIG. 4, the molar ratio of "N/O" of the silicon nitride films according to the present invention is at least two times higher than that of the known silicon nitride film. Furthermore, the molar ratio of the line denoted as "100% $NH_3$" is higher than that of "$N_2/H_2$". Accordingly, a very low concentration of oxygen in the silicon nitride film can be achieved by the ammonia gas used as the nitrogen containing gas. In addition, in FIG. 4, at every nitridation time, the oxygen concentration of the silicon nitride film formed by using the ammonia gas is advantageously lower than that of film formed by the nitrogen and hydrogen mixture.

Figure 5:
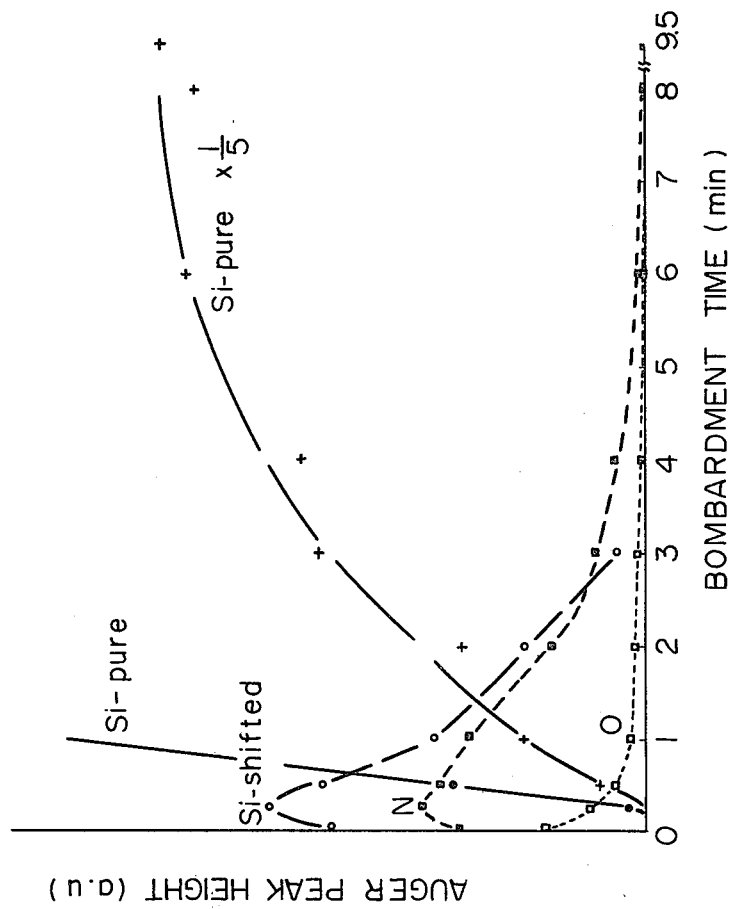
FIG. 5 graphically illustrates an Auger peak height of silicon, oxygen and nitrogen of a silicon nitride film formed by the method of the present invention.

In FIG. 5, the Auger peak height (in arbitrary units) of "Si-pure" (the silicon not combined with another element), "Si-shifted" (the silicon combined with nitrogen or oxygen), N(nitrogen) and O(oxygen) of a silicon nitride film is graphically illustrated. For FIG. 5 the silicon nitride film was formed by the method of the present invention under the following conditions.

Nitridation temperature: 1050° C.
Nitridation time: 100 minutes
Nitrogen containing gas: ammonia ($NH_3$)

Voltage of high frequency power: 7 kV
Silicon substrate: Floating zone (FZ) substrate In the Auger analysis of the silicon nitride film the argon ions were bombarded onto the silicon nitride film for a period of 9.5 minutes. The profiles of the curves in FIG. 5 deviate slightly from the actual distribution of the elements of the silicon nitride film due to the so called knock on effect.

It will be apparent from FIG. 5 that silicon is combined with a high concentration of the nitrogen and a low concentration of oxygen at the surface of the FZ substrate subjected to the direct thermal nitridation. Accordingly, a silicon nitride film containing a low concentration of oxygen can be produced according to the method of the present invention.

Figure 6:
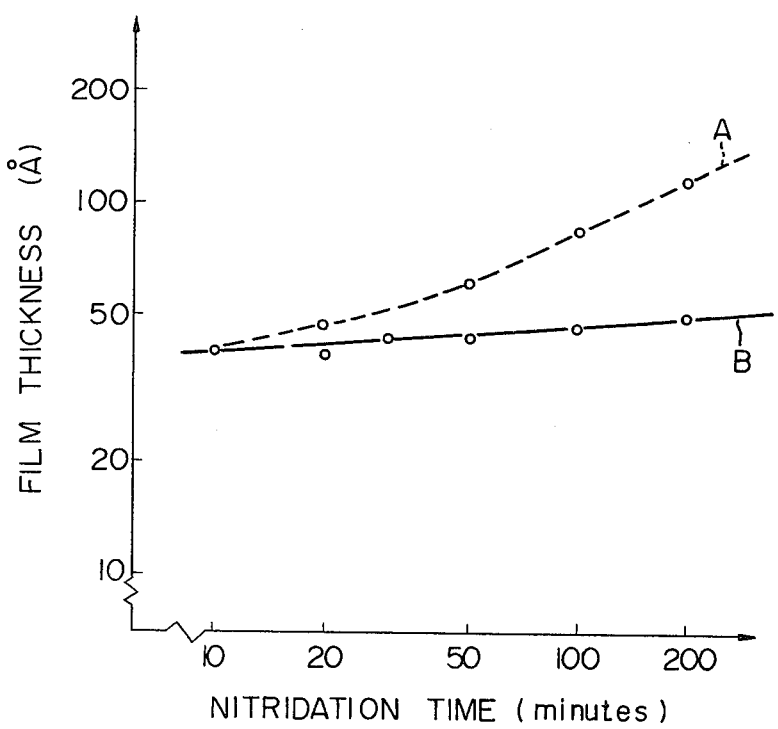
FIG. 6 graphically illustrates a thickness of silicon nitride films formed by the method of the present invention (A) and a known direct thermal nitridation method (B)

In FIG. 6, the relationship between the thickness of silicon nitride film and the nitridation time is illustrated. Referring to FIG. 6, the curve A indicates the thickness of a silicon nitride film produced by the method of the present invention under the following conditions.

Nitridation temperature: 1030° C.
Nitrogen containing gas: ammonia ($NH_3$)
Pressure of ammonia gas: $10^{-1}$ torr
Voltage of high frequency power: 5 kV
Frequency of high frequency power: 400 KHz The curve B indicates the thickness of a silicon nitride film formed by a known direct nitridation method under the following conditions.

Nitrogen containing gas: ammonia ($NH_3$)
Nitridation temperature: 1200° C.

As is apparent from a comparison of the dotted line curve A (the present invention) with the solid line curve B (the known method), in FIG. 6, the growth rate of silicon nitride film in the curve A is considerably higher than in the curve B. In order to form a 50 Å thick insulating film, 30 minutes of nitridation time is sufficient in the method of the present invention, but 200 minutes of nitridation time is necessary in the known method.

The 50 Å thick silicon nitride film produced by both methods was subjected to a thermal oxidation under dry oxygen at 1150° C. The silicon nitride film of the present invention could mask the silicon substrate from the dry oxygen even at a testing period of approximately 120 minutes, while the masking property of the silicon nitride film of the known method was lost at a testing period of approximately 110 minutes. Therefore, the silicon nitride film formed by the present invention has a strong masking property and, hence, a dense structure.

The masking property of the silicon nitride film according to the present invention was also excellent against the diffusion of impurities, such as P, B and As.

The present invention has been explained above with regard to an embodiment of the method illustrated in FIG. 2. Now the present invention will be explained with regard to the other embodiments thereof.

The ammonia ($NH_3$) gas preferably has a purity of 99.99% or higher. When ammonia gas having such purity is used as the nitrogen containing gas, the oxygen concentration of the silicon nitride film can be reduced to less than 10 molar %.

In an embodiment of the method according to the present invention, the gas plasma may be generated by a capacitance coupling of a pair of electrodes with the inner space of the reaction chamber. That is, a pair of the electrodes in semicircular form is arranged on the outer surface of the reaction chamber and an AC voltage of for example, 10 kV, is applied between the electrodes.

Figure 7:
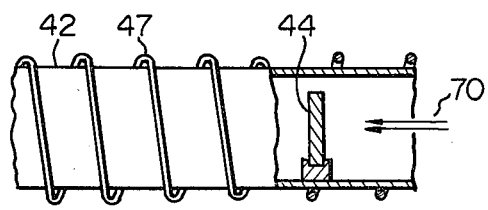
FIG. 7 is a partial cross sectional view of a reaction chamber for direct nitridation of a semiconductor silicon substrate according to the present invention.

In another embodiment of the method according to the present invention, which is illustrated in FIG. 7, the silicon substrate 44 is heated to nitridation temperature by means of a laser beam 70 or by means of both a laser beam and induction heating. The laser beam may be a ruby, $CO_2$, Ar or YAG laser beam has an energy density for example in the range from 1 to less than $10^3$ Joule/$cm^2$. The laser beam 70 is scanned over the surface of the silicon substrate 44 to heat the substrate.

Figure 8:
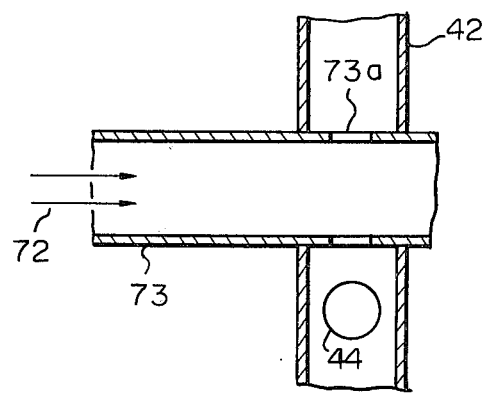
FIG. 8 is a horizontal cross sectional view of an apparatus for the direct nitridation of a semiconductor silicon substrate according to the present invention.

In another embodiment of the method according to the present invention, which is illustrated in FIG. 8, a microwave 72 having a frequency of, for example, 2.45 GHz is passed through a waveguide 73 having apertures 73a communicated with a reaction chamber 42. The nitrogen containing gas is activated or converted to gas plasma by the microwave 72.

In another embodiment of the method according to the present invention, a silicon boat or a silicon carbide boat is used to support a silicon substrate. The silicon substrate is heated to nitridation temperature due to the conduction of heat from the silicon (Si), or silicon carbide (SiC) boats which are induction-heated by a high frequency current source. When the silicon or silicon carbide boats include impurities at a higher concentration than that of the silicon substrate, the silicon substrate can be effectively heated to a required nitridation temperature. With this embodiment, contamination of the silicon nitride film due to carbon impurities from a carbon boat can be prevented.

In another embodiment of the method according to the present invention, a tube of the reaction chamber consists of silicon (Si) or silicon carbide (SiC) of a high enough quality to not cause the absorption of the high frequency field in the tube. When silicon or silicon carbide is used for the tube of the reaction chamber instead of quartz, a silicon carbide film having a high purity can be obtained because the tube does not contain oxygen which is liable to decompose.

Figure 9:
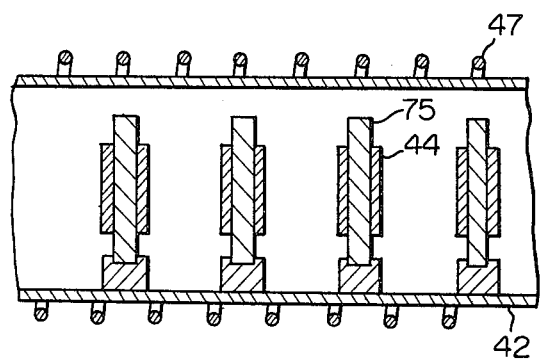
FIGS. 9 and 10 are a cross sectional view of an apparatus for the direct nitridation of a semiconductor silicon substrate according to the present invention.

In another embodiment of the method according to the present invention, which is illustrated in FIG. 9, a plurality of silicon substrates 44 are positioned vertically in a reaction chamber 42 and spaced from each other at an equal distance. Carbon plates 75 provided with a silicon carbide (SiC) coating thereon are also positioned vertically in the reaction chamber 42 and each of the carbon plates 75 supports one silicon substrate 44 on each of its two sides. Then, a gas plasma is generated in the space between a pair of the silicon substrates.

Figure 10:
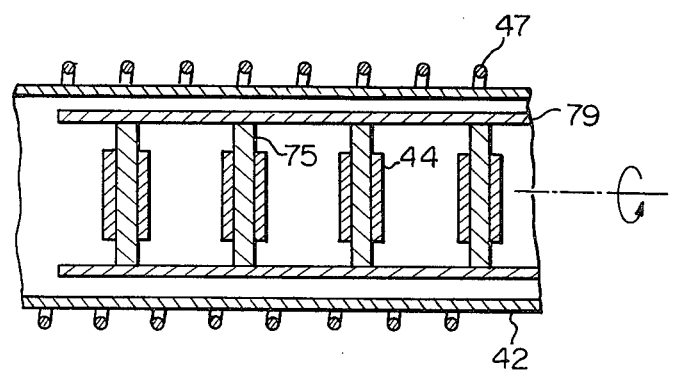

In another embodiment of the method according to the present invention, which is illustrated in FIG. 10, the carbon plates 75 are secured by rods 79 made of, for example, quartz, at the edge thereof and are rotated around the central axis of the reaction chamber 42.

In an embodiment of the method according to the present invention, a silicon nitride film is formed by direct nitridation in a gas plasma and is then heat treated in an ammonia atmosphere (non plasma atmosphere), thereby providing a silicon nitride film with a denser structure than that obtained by the direct nitridation mentioned above. When a high temperature of direct nitridation within the range of from 800° to 1300° C. cannot be achieved, due to a low heat resistance of the reaction chamber, it is advantageous to carry out the heating in the ammonia atmosphere. The heating in the ammonia atmosphere may be carried out at 1200° C. for a period of 1 hour.

In another embodiment of the method according to the present invention, a silicon nitride film is formed by direct nitridation in a gas plasma and is then subjected to a heat treatment in an oxygen containing atmosphere, so as to oxidize the surface of the silicon nitride film. An incorporation of positive electric charges in the silicon nitride film is prevented by the oxidized surface. When a so treated silicon nitride film is used as an insulation film of an MOS diode, the flat band voltage ($V_{FB}$) of the MOS diode can be decreased by 0.5 V.

In another embodiment of the method according to the present invention, a region of the silicon substrate is substantially amorphous and that region is subjected to direct nitridation in a gas plasma. When ions, such as argon or nitrogen ions, are implanted on the silicon substrate, the substantially amorphous structure can be formed on the surface of the silicon substrate. The ions may be nitrogen ions or argon ions. The growth rate of silicon nitride can be increased by the substantially amorphous structure of the silicon substrate over the growth rate on a crystalline silicon substrate. When argon ions having an energy of 150 KeV are implanted into a silicon substrate in a dosing amount of $1 \times 10^{16}$ cm$^{-2}$, the growth rate increase mentioned above is approximately 30%.

Figure 11:
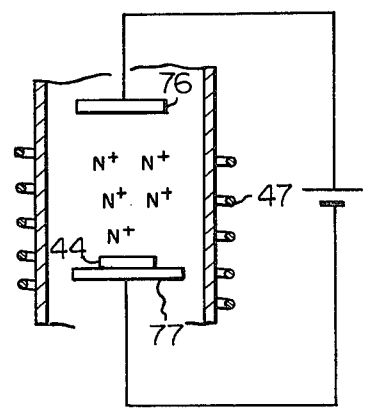
FIG. 11 is a schematic drawing of an apparatus for the direct nitridation of a semiconductor silicon substrate according to the present invention, in which a DC voltage is applied to the plasma gas.

In another embodiment of the method according to the present invention, which is illustrated in FIG. 11, a silicon substrate 44 is supported by an appropriate means between an anode 76 and cathode 77, and gas plasma having a positive electric charge is forced to move toward the silicon substrate 44. A DC bias is applied to the anode 76 and cathode 77. In FIG. 11, the positively charged particles of gas plasma are indicated schematically by the symbol "N+". When a DC bias of 1 kV is applied between the anode and cathode, the growth rate of a silicon nitride film can be increased by 50% over that resulting from direct nitridation in gas plasma without application of a DC voltage.

Figure 12:
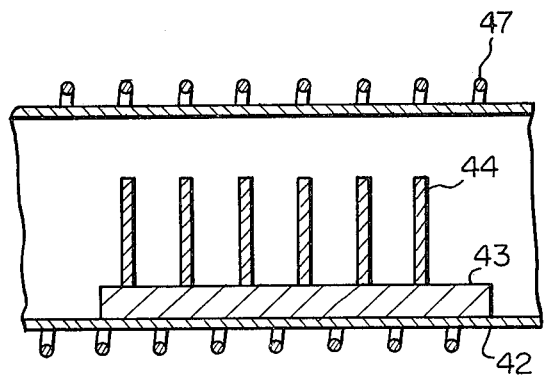
FIG. 12 is a drawing similar to FIGS. 9 and 10.

In another embodiment of the method according to the present invention, which is illustrated in FIG. 12, silicon substrates 44 are directly heated by induction heating of a coil 47. In order to directly induction-heat the silicon substrates 44, the silicon substrates 44 should have a low resistivity. When the silicon substrates 44 comprise a heavily doped semiconductor silicon body and a relatively lightly doped epitaxial silicon film, the epitaxial silicon film can be indirectly induction-heated by the coil 47.

Figure 13:
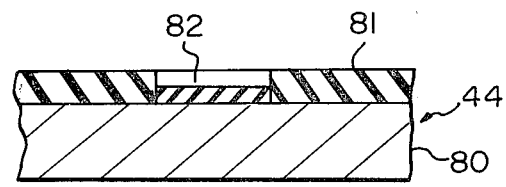
FIG. 13 is a cross sectional view of a semi-conductor silicon substrate.

In another embodiment of the method according to the present invention, which is illustrated in FIG. 13, a selective nitridation of a silicon substrate 44 is conducted in such a manner that a region of a silicon semiconductor 80 selectively exposed through a mask, for example, a silicon dioxide mask 81, is subjected to direct nitridation in a gas plasma. As a result, a silicon nitride film 82 is selectively formed on the silicon semiconductor 80.

In another embodiment of the method according to the present invention, a silicon nitride film is formed by a direct nitridation in gas plasma on one or more silicon regions or silicon islands, which regions and islands are formed on an insulating substrate, such as a sapphire substrate of an SOS device.

When the silicon nitride film formed by the method of the embodiments explained hereinabove is used for a gate insulating film of MISFETs, the threshold voltage of a channel region of the MISFETs can be satisfactorily stabilized because drift ions are not present in the film and the injection of carriers from the film into the channel region does not take place.

The present invention will now be further illustrated by examples.

EXAMPLE 1

A direct nitridation of silicon was conducted by using an apparatus as illustrated in FIG. 2.

| The conditions of direct nitridation were as follows. | |
|---|---|
| Pressure within the reaction chamber | : $10^{-1}$ torr |
| Frequency of high frequency power | : 400 KHz |
| Voltage of high frequency power | : approximately 5 kV |
| Nitridation temperature (temperature of silicon substrate) | : 1030° C. |
| Nitrogen containing gas | : ammonia (NH$_3$) |
| Nitridation time | : 20 minutes |

As a result of the direct nitridation, silicon nitride film having a thickness of approximately 50 Å was formed. When the silicon nitride film was etched by a Seccoetchant, no defects were detected in the substrate beneath the silicon nitride film. When the silicon nitride film was etched at 24° C. by a solution of seven volume part of ammonia fluoride (NH$_4$F) and 1 volume part of hydrofluoric acid (HF), the etching rate was 10 Å/min.

EXAMPLE 2

The procedure of Example 1 was repeated. However, the silicon nitride film formed by the direct nitridation was then heat treated in an ammonia atmosphere at 1200° C. for 1 hour. The etching rate of the silicon nitride film by the etching solution mentioned in Example 1 was decreased to a level lower than in Example 1.

EXAMPLE 3

The procedure of Example 1 was repeated. However, prior to the direct nitridation, the silicon substrate was ion implanted by argon ions of an energy of 150 KeV at a dosing amount of $1 \times 10^{16}$ cm$^{-2}$. The growth rate of the silicon nitride film was increased by about 30% as compared with that of Example 1.

EXAMPLE 4 (CONTROL EXAMPLE)

A silent discharge has been conventionally used for the formation of a silicon dioxide (SiO$_2$) film by CVD. In the present example, a silent discharge was utilized to form a gas plasma of nitrogen containing gases and a direct nitridation was carried out by using the so obtained gas plasma.

Figure 14:
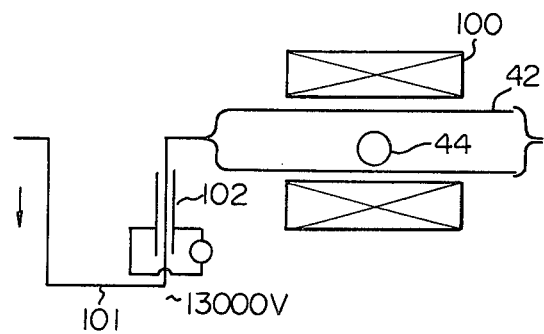
FIGS. 14 and 15 are schematic drawings of apparatuses the direct nitridation semiconductor substrate.

The apparatus used for the direct nitridation is illustrated in FIG. 14, wherein the reference numerals 100, 101 and 102 indicate a heating means, a line for supplying a nitrogen containing gas into the reaction chamber 42, and a silent discharging apparatus, respectively. As the nitrogen containing gas, nitrogen gas, ammonia gas, and a gas mixture of nitrogen and hydrogen were used alone and in combination with an inert gas. The nitrogen containing gases were silent-discharged in the silent discharge apparatus 102 and, then, supplied into the reaction chamber 42. The structure of the obtained silicon nitride films was less dense than that of the known direct nitridation films.

EXAMPLE 5 (CONTROL EXAMPLE)

Plasma gas activated by a microwave has conventionally been used for oxidizing a silicon substrate within a reduced atmosphere. The oxidizing rate of silicon in the plasma gas is higher than that in the conventional CVD process for the formation of silicon dioxide ($SiO_2$). In the present example, microwave activation was utilized to form a gas plasma of nitrogen gas and a direct nitridation was carried out by using the so formed gas plasma.

Figure 15:
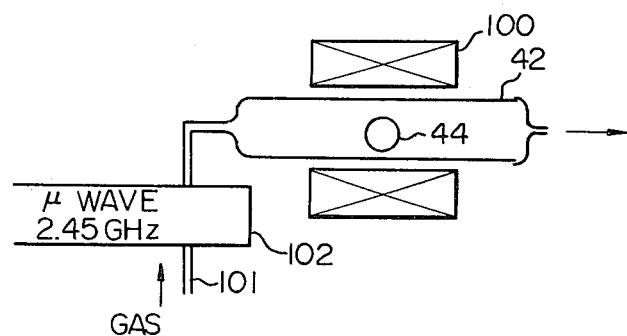

The apparatus used for the direct nitridation in gas plasma mentioned above is illustrated in FIG. 15, wherein the reference numeral 102 indicates a waveguide. The frequency of the microwave was 2.45 GHz and the reaction chamber 42 was evacuated to 1 torr. It was impossible to form a dense silicon nitride film.

What we claim is:

1. A method for forming an insulating film on the surface of at least one semiconductor silicon body, wherein the insulating film is formed of silicon nitride by direct nitridation in a direct nitridation reaction chamber, comprising
    positioning each semiconductor body in the direct nitridation reaction chamber,
    generating a gas plasma of a nitrogen containing gas in the direct nitridation reaction chamber, and
    heating the semiconductor silicon body to a temperature of from approximately 800° to approximately 1300° C. within the gas plasma.

2. A method according to claim 1, wherein said nitrogen containing gas is ammonia.

3. A method according to claim 2, wherein said ammonia has a purity of not less than 99.99 volume %.

4. A method according to claim 1, wherein said nitrogen containing gas is hydrazine.

5. A method according to claim 1, wherein said nitrogen containing gas is nitrogen.

6. A method according to claim 1, wherein said nitrogen containing gas is a mixture of hydrogen and nitrogen.

7. A method according to claim 6, wherein the volume ratio of hydrogen and nitrogen is in the range of from 1:1 to 1:3.

8. A method according to claim 1, wherein said nitrogen containing gas is a mixture of nitrogen and ammonia.

9. A method according to claim 2, 4, 5, 6, 7 or 8, wherein said nitrogen containing gas includes an inert gas.

10. A method according to claim 1, wherein the nitridation temperature is from 800° to 1200° C.

11. A method according to claim 1, comprising heating each said semiconductor body in said gas plasma for a time in the range of from approximately 1 minute to $10^3$ minutes to form said silicon nitride film to have a thickness of not less than 50 Å.

12. A method according to claim 1, wherein said semiconductor silicon body is supported in said direct nitridation reaction chamber by a supporting means which comprises at least carbon body with a silicon carbide coating thereon.

13. A method according to claim 1, wherein said semiconductor silicon body is supported in said direct nitridation reaction chamber by a supporting means which comprises a silicon body.

14. A method according to claim 1, wherein said semiconductor silicon body is supported in said direct nitridation reaction chamber by a supporting means which comprises a silicon carbide body.

15. A method according to claim 12, 13 or 14, said heating of each said semiconductor silicon body comprising induction heating of said supporting means by a high frequency power heating means, and wherein said generating of said gas plasma is due to induction heating by said high frequency power heating means.

16. A method according to claim 1, comprising generating said gas plasma by capacitive coupling of the inner space of said reaction chamber with a pair of electrodes located externally of said reaction chamber and to which an AC voltage is applied.

17. A method according to claim 1, wherein said gas plasma is generated by the conduction of a microwave through said nitrogen containing gas.

18. A method according to claim 1, 12, 13, 14, 16 or 17, wherein a laser beam is scanned over the surface of said semiconductor silicon substrate to heat said semiconductor body.

19. A method according to claim 1, wherein a plurality of said semiconductor silicon bodies are positioned vertically in said direct nitridation reaction chamber by respective supporting means.

20. A method according to claim 19, said direct nitridation reaction chamber having a central axis, said method comprising rotating said supporting means around said central axis.

21. A method according to claim 19, wherein said semiconductor bodies are supported on the surfaces of supporting plates which are positioned vertically in said direct nitridation reaction chamber.

22. A method according to claim 21, wherein said supporting plates are rotated around the central axis of said direct nitridation reaction chamber.

23. A method according to claim 1, comprising heat treating said silicon nitride film formed by direct nitridation in a nonplasma ammonia atmosphere.

24. A method according to claim 1, comprising heat treating said silicon nitride film in an oxygen atmosphere so as to oxidize the surface of said silicon nitride film.

25. A method according to claim 1, wherein a region of said semiconductor substrate is provided with a substantially amorphous structure and said silicon nitride is formed on said region.

26. A method according to claim 25, wherein said substantially amorphous structure is produced by ion implantation.

27. A method according to claim 1, wherein a DC bias is applied to said gas plasma, said DC bias having such a polarity that the positively charged particles of said gas plasma are forced to move toward each said semiconductor silicon substrate.

28. A method according to claim 1, said heating of each said semiconductor silicon body comprising direct heating by induction heating with a high frequency power heating means.

29. A method according to claim 28, wherein each said semiconductor silicon body comprises a heavily doped silicon substrate.

30. A method according to claim 1, comprising forming said film of silicon nitride on a region of said semiconductor silicon substrate selectively exposed by a mask.

* * * * *

UNITED STATES PATENT AND TRADEMARK OFFICE
CERTIFICATE OF CORRECTION

PATENT NO. : 4,298,629
DATED : November 3, 1981
INVENTOR(S) : Takao Nozaki et al.

It is certified that error appears in the above—identified patent and that said Letters Patent is hereby corrected as shown below:

Front page, [57] Abstract, line 9, "C." s/b --C--.
Col. 1,    line 39, "C." s/b --C--.
Col. 2.    line 50, "C." s/b --C--.
Col. 3,    line 20, "C." s/b --C--;
           line 28, "inet" s/b --inert;
           line 63, "cross sectional" s/b --cross-sectional--;
           line 66, "cross sectional" s/b --cross-sectional--.
Col. 4,    line 1 "cross sectional" s/b --cross-sectional--;
           line 10, ",and;" s/b --;and--;.
Col. 5,    lines 39, 41, 43, 46, 47, 50 and 53, "C." s/b --C--.
Col. 6,    lines 2, 3, 12 and 44, "C." s/b --C--,
           line 13, Table 1, under heading "Element," "0" s/b --O--.
Col. 8,    line 65, "C." s/b --C--.
Col. 9,    line 1, "C." s/b --C--.
Col. 10,   lines 18, 28 and 36, "C." s/b --C--.
Col. 11,   line 60, after "least" insert --one--.

Signed and Sealed this

Thirteenth Day of April 1982

[SEAL]

Attest:

GERALD J. MOSSINGHOFF

Attesting Officer    Commissioner of Patents and Trademarks